United States Patent [19]

Sullivan

[11] Patent Number: 4,971,895
[45] Date of Patent: Nov. 20, 1990

[54] DOUBLE EXPOSURE METHOD OF PHOTOPRINTING WITH LIQUID PHOTOPOLYMERS

[76] Inventor: Donald F. Sullivan, 56 W. White Oak Rd., Paradise, Pa. 17562

[21] Appl. No.: 384,921

[22] Filed: Jul. 26, 1989

Related U.S. Application Data

[63] Continuation of Ser. No. 110,505, Oct. 20, 1981, abandoned, which is a continuation-in-part of Ser. No. 894,912, Aug. 15, 1986, abandoned, which is a continuation-in-part of Ser. No. 690,998, Jan. 14, 1985, Pat. No. 4,618,567.

[51] Int. Cl.$^5$ .............................. G03F 1/00; G03C 5/00
[52] U.S. Cl. ..................................... 430/328; 430/270; 430/394; 430/325; 430/396; 430/326; 430/5; 522/902; 522/915
[58] Field of Search ................. 430/5, 270, 324, 322, 430/326, 394, 396, 319, 325, 328; 522/902, 915

[56] References Cited

U.S. PATENT DOCUMENTS

| | | | |
|---|---|---|---|
| 3,591,378 | 7/1971 | Altman | 430/326 |
| 3,888,672 | 6/1975 | Lee | 430/328 |
| 4,148,934 | 4/1979 | Baker | 427/54 |
| 4,260,675 | 4/1981 | Sullivan | 430/396 |
| 4,291,116 | 9/1981 | Tibbetts | |
| 4,291,118 | 9/1981 | Boduch et al. | |
| 4,411,931 | 10/1984 | Duong | |
| 4,424,089 | 1/1984 | Sullivan | 156/155 |
| 4,436,806 | 3/1984 | Rendulic | |
| 4,528,261 | 7/1985 | Hauser | |
| 4,618,567 | 10/1986 | Sullivan | |
| 4,657,839 | 4/1987 | Sullivan | 430/258 |
| 4,666,824 | 5/1987 | Messer | 430/325 |
| 4,732,844 | 3/1988 | Ota et al. | 430/394 |
| 4,764,452 | 8/1988 | Ohno | 430/910 |

FOREIGN PATENT DOCUMENTS 0051150 3/1986 Japan.
1181114 2/1970 United Kingdom.

OTHER PUBLICATIONS

IBM Technical Disclosure Bulletin; vol. 14, No. 9; Feb. 1972.
Photoresist Materials and Process, McGraw-Hill, 1975, p. 121.

*Primary Examiner*—Marion C. McCamish
*Assistant Examiner*—Christopher D. RoDee
*Attorney, Agent, or Firm*—Laurence R. Brown

[57] ABSTRACT

A photopolymer layer is used as a radiation transparent phototool replacing a light blocking phototool in the photographic process of producing solder mask layers on printed wiring boards. Various simplification and energy reducing steps are introduced with off-contact photoprinting of patterns on liquid photopolymers having special characteristics that permit the polymerization of patterned outer skin areas partly through the thickness thereof with a controlled amount of radiation energy. This creates an in-situ surrogate phototool that permits further polymerization throughout the thickness of the layer with controlled quantities of unpatterned radiation energy. Photodiscrimination is provided by changes of photosensitivity in the layer transparent to radiation rather than by opaque imaging. Thus a first low energy photoflash through an off-contact phototool with uncollimated radiation creates on a liquid photopolymer surface two contrasting patterned areas of liquid polymer and polymerized skin. This can be achieved in an inert gas atmosphere. The second curing step in the presence of an inhibiting gas such as air with controlled radiation energy then fully cures through the thickness of the layer those skin covered portions without curing the liquid surfaced areas.

9 Claims, 3 Drawing Sheets

DOUBLE EXPOSURE METHOD OF PHOTOPRINTING WITH LIQUID PHOTOPOLYMERS

BACKGROUND ART

This application is a continuation, of application Ser. No. 07/110,505, filed Nov. 20, 1987, now abandoned, which is a continuation-in-part of my copending patent application, Ser. No. 894,912, filed Aug. 15, 1986, now abandoned, for Photoprinting Liquid Photopolymer Layers on Substrates, which in turn is a continuation-in-part of my copending patent application Ser. No. 690,998, filed Jan. 14, 1985, now U.S. Pat. No. 4,618,567, Oct. 21, 1986 for High Resolution Liquid Photopolymer Coating Patterns Over Irregular Printed Wiring Board Surface Conductors.

TECHNICAL FIELD

This invention relates to photoprinting with photopolymers, and more particularly it relates to the manufacture of printed wiring boards and the formations of solder mask layers over printed wiring traces with thick photopolymer layers of the order of 0.004 inch (0.01 cm) or greater in thickness.

This co-pending U.S. application provides a process for photopatterning liquid photopolymers, which are applied to a substrate as a liquid coating and there are exposed through a phototool pattern to non-collimated radiation while in the liquid state to convert the light-struck pattern areas to adhering patterns of polymerized polymer firmly bonded to the substrate. Unexposed photopolymer portions still in liquid state are then removed in a solvent bath. During exposure through an off-contact phototool pattern, the liquid photopolymer layer is blanketed with a non-reacting gas to obtain a dry outer skin surface in the solid state with modest light energy and high resolution. Under the skin the polymer is still in the liquid state. A second exposure step is made through the phototool to harden the still liquid photopolymer layer portion through its thickness and firmly bond the desired pattern to the substrate surface. High resolution patterns are obtained with thick films of 0.004 inch (0.01 cm) or greater in thickness giving high relief image patterns that may in part cover conductor traces in relief on the substrate surface.

The prior art provides differing processes and apparatus for photopatterning photopolymers in the liquid state through phototool patterns both off-contact and on-contact with the polymer surface. U.S. Pat. No. 4,436,806, Mar. 13, 1984, F. J. Rendulic, et al. collimates radiated U.V. light in an off-contact process of patterning a coating of liquid photopolymer on a printed wiring board. This is a one step curing process.

Many examples of on-contact processes for photopatterning liquid photopolymers are available in the art, but they generally are not pertinent to this invention which provides for off-contact photopatterning.

It is known in the art that oxygen and air on the surface of a polymer inhibits the polymerization, thus requiring more energy than required when the surface is shielded from oxygen, such as by disposal of a non-reacting thin plastic film over the surface. W. DeForest in *Photoresist Materials and Process*, McGraw-Hill 1975, Page 121, discusses the oxygen effects on photopolymerization and the use of an inert gas environment to reduce or eliminate the effect of the oxygen on polymerization.

Multiple step UV curing of plastic materials is taught by U.S. Pat. No. 4,411,931, Oct. 25, 1983 to C. H. Duong, wherein vinyl tile substrates are coated with urethane-acrylate coating compositions. Combinations of shorter and longer wavelength radiation of stronger and weaker intensity are used to control surface texture.

Curing of liquid photopolymer layers partially through their thickness is also known in the art, wherein the surface is left soft in a contact printing procedure that cures from the substrate surface outwardly through the thickness of the layer. U.S. Pat. No. 4,528,261, July 9, 1985, W. P. Hauser thus discloses such a technique where the soft surface is then moved into contact with a printed wiring board and is then cured in a second photo step. U.S. Pat. No. 4,291,116, Sept. 22, 1981 C. C. Tibbetts puts down two layers of liquid polymer on opposite sides of a stencil and cures them in two separate steps through the same phototool pattern in contact with the first layer, leaving an outer layer surface in contact with air in the liquid state as excess wasted polymer.

In these prior art processes there are several significant unresolved problems presented. Some are now discussed.

A phototool deterioration problem is introduced whenever contact printing is involved, because of wear due to the abrasiveness of the polymer layer on a phototool image surface in contact. If the image surface is not in contact and disposed on the remote side of a phototool carrier sheet, then the resolution is sacrificed because of interface reflection problems. Furthermore, the liquid photopolymer in cured areas tends to bond to the phototool and in the uncured areas the polymer tends to accumulate undesirably on the phototool surface.

Wet surface coatings result when most UV curable liquid photopolymer layers are photopatterned with air, oxygen or other cure inhibiting gases on the surface. Thus, a considerable increase in light energy is required to effect polymerization. Furthermore, the outer surface coating is not easily cured to a dry state but is generally left wet. If enough energy is used in the photopatterning step to dry the outer layer, the polymer is overexposed elsewhere, resulting in low resolution distorting the photopatterned image from that of the phototool.

Typically the wet exterior surface may comprise 20% of the layer thickness. This results in considerable waste, since it is washed off in the development phase when the unpolymerized portions of the pattern are dissolved in solvent and washed out. Thus, for example in thick film solder mask layers disposed over circuit wiring traces, the insulation properties are significantly reduced. Use of compensating thicker layers would result in poorer resolution, since it is difficult to get high resolution with liquid photopolymers and with thick layers. Furthermore the developer solution, air dust, etc. may chemically or physically react on the liquid surface to permanently lock-in contaminates reducing the desired insulation property, or otherwise adversely affecting the performance characteristics.

A bonding problem results when photo-polymerizing thick layers of photopolymer of the order of 0.004 inches (0.01 cm) or greater, necessitated to overlay circuit traces that may extend up to 0.004 inches (0.01 cm) in relief from the substrate surface. The polymer layers thus must be hardened through the thickness down to the substrate and there be firmly bonded to the substrate surface. Again overexposure resulting from this need be avoided to eliminate deteriorization of the resolution.

In the parent patent hereto, namely U.S. Pat. No. 4,618,567, resolution was increased by means of a two photopatterning steps wherein the first is off-contact and the second is essentially on-contact by means of a plastic film layer contacting the wet outer surface remaining from the first photo step. This has the disadvantages of contact printing including the offset of some of the wet surface polymer onto the film layer and bonding of the cured pattern from the second photo step to the plastic film.

Non-collimated radiation causes image distortion in off-contact photo printing steps. Shadows are produced on the substrate so that it is difficult to get exact correspondence between the printed photopolymer image and that on the phototool.

Dissimilar thicknesses of the polymer layer, particularly in the case of solder mask coatings over circuit wiring traces, may give as much as five to one differences in thickness of the polymer layer to be cured. This happens with 0.005 inch (0.013 cm) thick layers over the substrate surface and circuit traces thereon extending 0.004 inch (0.01 cm) above the substrate surface. The 0.001 inch (0.003 cm) thick portions over the traces then tend to be overexposed with poor resolution if enough energy is used to assure that the 0.005 inch (0.012 cm) thickness over the substrate surface is polymerized through its thickness and bonded to the substrate.

The salvage of faulty wiring boards is a desired feature, not generally possible in the prior art. Complex circuit boards may be quite expensive, and thus rejects because of improper solder masking require destruction of the boards if the solder mask covers them with a bond so strong that the solder mask cannot be stripped without damage to the board, as is generally the case in the prior art.

High production costs resulting from high and inefficient energy requirements and low production speeds have been a problem throughout the prior art processes for photoprinting thick liquid polymer layers such as used in solder masks over printed wiring board circuit traces.

OBJECTS OF THE INVENTION

It is therefore a general object of this invention to provide improved liquid photopolymer photopatterning processes and products resolving these aforementioned problems in the prior art.

A more specific object of the invention is to provide a high resolution photopatterning process for thick liquid photopolymer layers, of the order of 0.004 inch (0.01 cm) or more in thickness, that may use a wide range of photopolymers in a simple, fast production cycle particularly suited for printed wiring boards.

Other objects, features and advantages of the invention will be found throughout the following description, the drawings and the claims.

DISCLOSURE OF THE INVENTION

High resolution patterns are formed with non-collimated actinic radiation (light energy) in photopolymer layers, which are sensitive to inhibiting gases, by means of a two step off-contact exposure process. A short flash exposure step first polymerizes the surface skin through a portion of the thickness of the polymer layer. A longer duration photoexposure step follows to cure the layer throughout its thickness and to bond it to the underlying substrate surface. To achieve this with a dry outer surface, the surface of the polymer layer is blanketed with a non-reacting gas such as nitrogen or carbon dioxide, which permits a polymerized dry outer surface to be formed with low light energy.

In one embodiment, an oxygen sensitive liquid photopolymer is coated onto a printed wiring board substrate to cover high relief metal wiring conductors extending therefrom. Then a short flashing photoexposure step through an off-contact phototool image with a non-reacting gas blanket over the surface of the polymer layer produces a polymerized skin pattern partially through the thickness of the layer in the pattern where the light is not blocked by the phototool image. The substrate may then be removed from the non-reacting gas atmosphere into air which serves to inhibit the polymerization of any uncured polymer patterns still in the liquid state on the surface. The air, when it contacts the liquid polymer regions of the surface, inhibits the cure throughout the depth of the layer with photo exposure energy levels that are sufficient to cure those patterned portions of the layer with the polymerized skin through the thickness of the layer and to bond the layer to the substrate surface. In terms of the photosensitivity of the liquid photopolymer pattern with the liquid state surface, it is essentially zero for that amount of light energy. By contrast the photosensitivity of the liquid photopolymer in the liquid state under the cured skin pattern is very high so that it may be polymerized with low energy levels over a duration that does not overexpose the polymer and thus reduce the resolution. Thus, the formation of the polymerized skin surface or cap to the polymer layer by a lower energy photo flash serves to sensitize the polymer throughout the thickness as contrasted to the liquid state surfaced (noncapped) portions of the layer.

This invention thus provides a process of improving the photo sensitivity of a liquid photopolymer layer in a pattern by photo-flashing through a phototool image establishing the pattern with only enough energy to partially pholymerize the layer through its thickness, with the outside surface of the layer polymerized. This is achieved by the presence of a gas blanket, or equivalent, that overcomes the oxygen, etc. inhibition characteristic of such liquid photopolymers.

Accordingly there is formed a photopolymer layer, fully transparent to photo energy over its entire surface, but separated into low and high sensitivity patterned areas, to thereby discriminate the curing capacity of the photoenergy radiated through the layer. This is in effect a completely transparent phototool, which nevertheless produces a surrogate image with the effect of a photoimaged transparency that blocks out radiation reaching the photopolymer layer.

This skin cured phototool has the distinct advantages of very high resolution capabilities. Firstly, it is formed with low photo energy so that overexposure distortion is not present. Secondly, it is in more intimate contact with the liquid photopolymer than any contact print could be, and actually extends below the photopolymer surface. This avoids any problems of interfacing, interspersed air bubbles, and dispersement of uncollimated light energy that could reduce resolution. Thus, a superior phototool, operating on a new principle, is afforded by this invention. There will be many applications, not now evident, of such discrimination in the sensitivity of photo sensitive layers, that can in effect be self inducted merely by a low energy photoflash. Furthermore, the fully transparent to radiation phototool in effect provided by this invention will have many applications not now evident.

This invention however does fully employ this phototool in an embodiment wherein a second photoexposure step may solely use that cured skin surface layer without the original phototool for the further curing of the layer throughout its thickness and the bonding of the layer to the substrate. This has the distinct advantage of dedicating a phototool on a production line only for an instant flash instead of for a full long cure cycle, and thus the production rate can be significantly improved.

In this second step, the photoexposure is achieved in air with an uncollimated low energy light source (because of the increased sensitivity of the liquid photopolymer) that does not cure the portions of the layer having a liquid state outer surface (which is inhibited by an air blanket on the surface), but which cures and bonds the patterned portion defined by the phototool in the first step. Thus, the photoflashed product of the first exposure step may be accumulated in a "light tunnel" for a controlled amount of energy level and cure time, with very simple procedural steps and equipment requirements.

Depending upon the characteristics of the liquid photopolymers being used, it may be desirable in the second step to use both the original phototool and the surrogate phototool together. Thus, a preferred photopolymer will have a large contrast in sensitivities of those portions of the layer with a cured skin and in the liquid state. If that characteristic is not present then the combination of the light blocking phototool and the transparent surrogate phototool will assure that the desired portions of the layer pattern are indeed fully cured and bonded.

With the two phototools in tandem, the two separate forms of photo pattern discrimination provide advantages. The light blocking phototool pattern prevents any light energy from entering the photopolymer, keeping it cooler, and preventing reflections from the substrate. Thus the unwanted resolution decreasing components are principally stray rays inherent in a non-collimated source. The additional phototool discrimination of stray light rays through desensitized polymer thus further preserve the resolution integrity. Any marginal higher sensitivity under the skin pattern due to the nature of a particular liquid photopolymer characteristic that would make energy levels or cure times critical are overcome in this embodiment. This embodiment better tolerates pigmentation, etc. in photopolymers that might disturb the transparency to radiation and cause longer cure periods, or those without sufficient photoinitiators that also require longer curing periods.

The second photo exposure step in general is done in the presence of an air blanket over the polymer surface, with an energy level high enough to bond the layer to the substrate and cure the skin covered portions throughout the layer thickness and low enough to leave the portions with the liquid phase surface in the liquid phase throughout the thickness of the layer.

In another embodiment, the two photo exposure steps can be performed in the reverse order to achieve different advantages. Thus the first exposure step through the off-contact phototool image is in the presence of an air blanket (inhibitor) over the surface of the liquid photopolymer. This is best done with a photopolymer having the characteristic of a lesser degree of inhibition in the presence of oxygen. Thus the first step with the significant amount of radiated energy over a more prolonged period than the flash and directed through the phototool is the classical step of curing the polymer layer through the thickness but leaving the surface wet, as described in Tibbets U.S. Pat. No. 4,291,116 for example. The second photo exposure step therefore constitutes the short flash exposure step in the presence of a blanket of inert gas over the polymer surface to cure the liquid polymer state skin portion of the layer thickness.

Note that former photographically sensitive layers including photopolymers have been photo processed with a single uniform photo speed characteristic. Thus, the almost infinite exposure time for liquid photopolymer surfaces in air for given below threshold levels of exposing radiation achievable with photopolymer characteristics can be contrasted with very short exposure times of less than one minute when the skin is polymerized to cap the liquid photopolymer surface as provided by this invention. Thus, in essence a very slow speed liquid photopolymer layer with a liquid phase surface exposed in air is changed into a high speed layer by means of a self priming short photo flash of about ten seconds with low energy in the presence of a protective gas blanket producing a polymerized outer skin on the liquid layer surface. Thereafter the same polymer layer when exposed in air is a high speed polymer requiring low energy photo radiation for polymerization.

THE PREFERRED EMBODIMENTS

Figure 1:
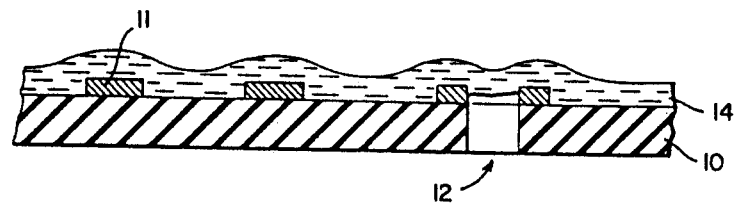
FIG. 1 is a fragmental sketch in cross section of a printed wiring board with an unexposed thick layer of liquid photopolymer solder mask resist overlying wiring conductors and substrate surface portions of a printed wiring board.

The following description refers to the accompanying drawings. In FIG. 1, a printed wiring board substrate 10, having circuit wiring traces 11 thereon extending above the substrate surface, typically 0.004 inch (0.01 cm), covered with a coating 14 of liquid photopolymer comprising for example a solder mask resist of a thickness, typically 0.005 inch (0.013 cm), for covering the tops of the conductors with a solder resistant layer (when cured), typically of 0.001 inch (0.003 cm) thickness. Such printed wiring boards contain through holes 12, into which the liquid polymer layer may sag, ring the walls, or bridge. The thickness of such polymer layers therefore vary considerably across the substrate surface, with thickness variations typically five to one between the thickness over the substrate surface and the top of the wiring traces. This presents a significant problem in obtaining high resolution patterns of the solder mask. Thus, overexposure with resulting poor resolution tends to occur in the thin layer portions over the traces when enough photopatterning energy is provided to cure the thick layer portions over the substrate surface and furthermore to bond the photopolymer layer firmly to the substrate surface.

Figure 2:
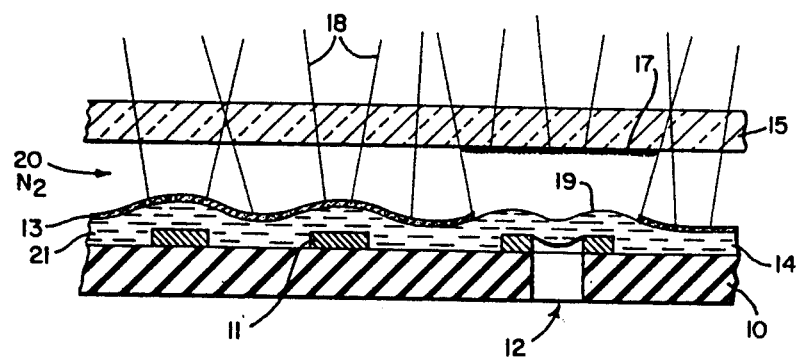
FIG. 2 is a system sketch in cross section of the photopolymer coated printed wiring board in position during a first off-contact photo-exposure step with uncollimated actinic radiation in the presence of an inert gas for forming a skin deep polymerized surface pattern on the liquid phase surface of the polymer.

This problem is resolved by this invention by reducing the amount of energy required for cure, by curing in two separate curing steps and by providing polymers with special characteristics which permit photopatterning without overexposing in the two step process. The first step is illustrated in FIG. 2, wherein a phototool comprising phototransparency 15 is spaced above and off-contact the liquid layer 14. Opaque radiation blocking image patterns 17 on the phototransparency 15 defines the desired pattern by defining areas of the photopolymer layer 14 which are to remain in the liquid state for removing in a solvent solution. The remainder of the patterned layer then is to be polymerized throughout its thickness and bonded to the substrate and conductor surfaces.

The non-collimated radiation 18 is preferable as a low cost energy source and can be used herein because the process minimizes any loss of resolution generally caused by the stray rays from the uncollimated radiation. Typically the radiation source is a 5 KW UV light source, such as a mercury metal halide lamp with peak output at 360 and 400 nanometer wavelengths positioned a distance of about 40 inches. When the gap 20 between the phototool 15 and the surface of the photopolymer has a non-reacting gas such as nitrogen or carbon dioxide therebetween, a ten second flash exposure, with an appropriate photopolymer composition, where light struck will polymerize a skin or capping portion 13 of the polymer layer extending downwardly partially through the layer thickness, such as to a depth of 0.001 in (0.003 cm) to 0.003 inch (0.008 cm). If this were a single step exposure of a duration of about 30 seconds or more so that the polymer layer 14 would be cured throughout its thickness and bonded to the surface of the substrate 10, overexposure would result significantly reducing the resolution, particularly over the thinner layer areas overlying the circuit traces 11, in part because of the increased sensitivity of the polymer layer caused by the inert gas blanket that overcomes the oxygen inhibition characteristic of the photopolymer surface in the liquid state. Furthermore in the areas 19 of the photopolymer layer which are to remain in the liquid state, the increased sensitivity could cause high radiation energy to polymerize undesirably these areas because of the inert gas blanket.

This outer barrier skin 13, produced in this first short flash step presents a dry or gelled outer polymerized surface that is not in the liquid polymer state. Thus, a shield is presented over the remaining under portion of the layer 21 still in the liquid polymer state. This shield has the property of non-sensitivity to the presence of an inhibiting gas on its surface as the photopolymer in the liquid state in regions 19. Thus this first exposure step converts the photopolymer layer of one photosensitivity (in the presence of air on the surface) to a layer having patterned areas of distinctly different photo sensitivities, as will be hereinafter used in the second exposure step. This is a distinctly different process from the conventional manner of forming a dry film photopolymer by pre-exposing a liquid polymer, as for example described in U.S. Pat. No. 4,291,118 Sept. 22, 1981 to P. Boduch et al, since it does not result in a uniform polymerization or hardening throughout the surface. Nor do these prior art dry film pre-exposed layers result in a photopolymer layer than is not subject to photoinhibition by air or oxygen on the surface.

This first step therefore has produced a surrogate phototool which is an integral part of the polymer layer 14 and which is distinguished by a pattern (corresponding to that of phototool 15) through which actinic radiation is processed in a discriminatory way. Although the photopolymer layer is transparent to actinic radiation, and therefore permits it to pass through the entire thickness of the layer throughout both the liquid state surfaced regions 19 and the skin capped regions 21, the polymerizing effect of that radiation is drastically altered between the two regions. More about this will be discussed in connection with a later embodiment.

Figure 3:
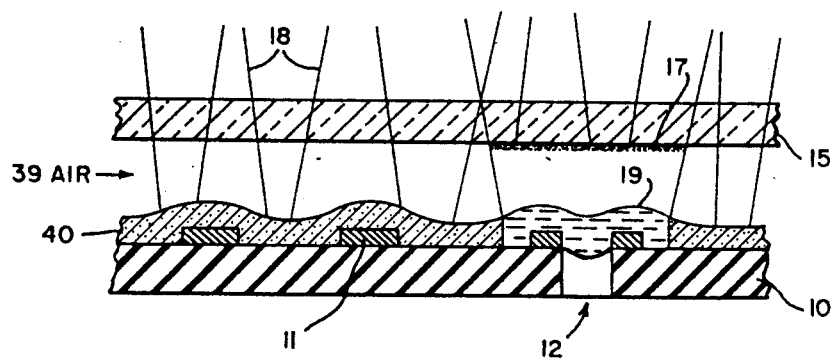
FIG. 3 is a system sketch in cross section of the photopolymer coated printed wiring board in position during a second sequential photo-exposure step with uncollimated actinic radiation in the presence of air for curing the photopolymer layer through its thickness and bonding it to the printed wiring board substrate over a pattern defined by the phototool image.

The second photopatterning step in one embodiment of the invention is illustrated by way of FIG. 3, wherein the inert gas blanket (N2) is replaced by an inhibiting gas 39 (air) that decreases the sensitivity of the polymer layer in those portions of the layer with a surface in the liquid polymer state. With the initial photopolymer layer 14 in the condition shown in FIG. 2 having a surrogate phototool, the embodiment of FIG. 3 thus has a tandem arrangement of two phototools with similar pattern designations in series between the actinic radiation source and the surface of the photopolymer layer 14. The conventional phototool transparency 15 has been formerly described as having a light blocking barrier image 17, whereas the light transparent portion of the photopolymer layer with its surface in the liquid state 19 serves as a light inactivating body that prevents the polymerization of the layer throughout its thickness in the presence of actinic radiation below a threshold level because of the inhibition action of the air blanket, or an equivalent inhibiting layer at the polymer surface. Conversely the capped skin layer 13 (FIG. 2) will permit the entire layer thickness to be cured in the presence of actinic radiation of low engery levels by shielding the surface from the inhibiting gas.

With a second exposure time of thirty seconds, the thick (0.005 in/0.013 cm) portions of the film become polymerized throughout their thickness and are bonded to the substrate 10 surface, as indicated by the hatching 40. The shadowed area 19 remains unpolymerized throughout its thickness, and the resulting resolution is not deteriorated by overexposure or the presence of stray light rays from the uncollimated radiation 18 reaching the shadowed areas 19. The unpolymerized areas are washed out with a solvent in a conventional manner, and the polymerized regions 40 withstand the developer solvent, without loss of polymer therefrom.

Note that the in-situ surrogate phototool pattern thus provided in FIG. 2 by means of skin layer 13 and corresponding liquid state surfaces 19 are not off contact and thus produce all the advantages of on-contact photoprinting without the corresponding prior art disadvantages hereinbefore set out. As a matter of fact this skin 13 phototool medium extends down into the photopolymer layer beneath its surface and thus gives even greater improvement than with contact printing with all its interfacing problems including the elimination of air bubbles.

Figure 5:
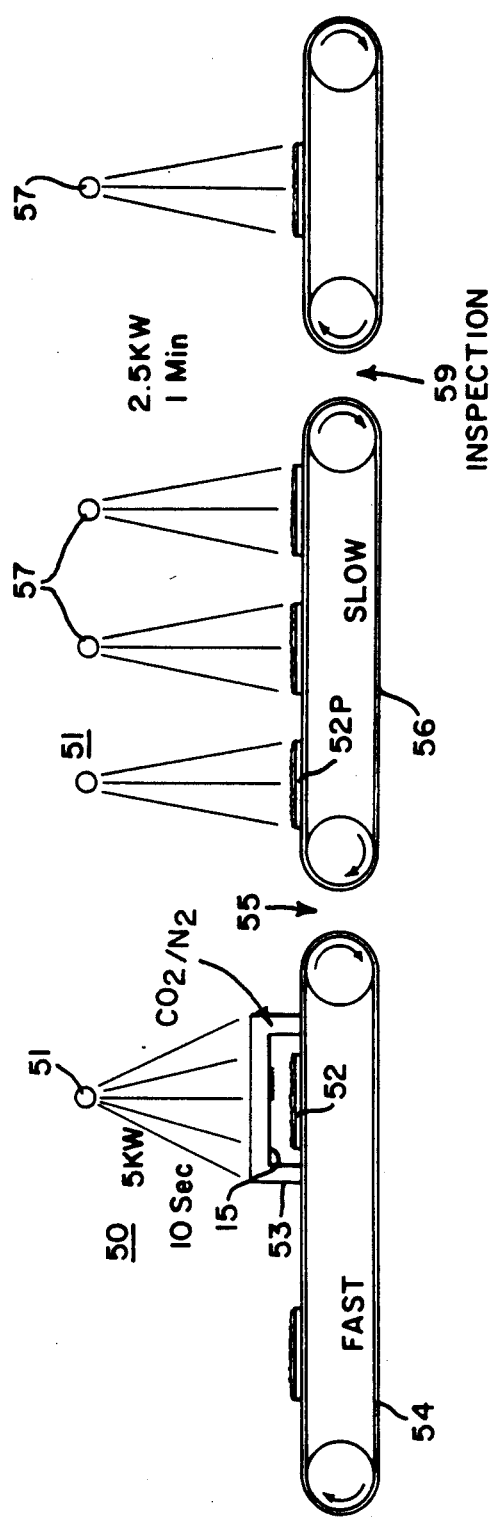
FIG. 5 is a system diagram illustrating the curing process of another embodiment of this invention, wherein a two step photoexposure process requires an external light blocking phototool image only in the first step.

It is also to be recognized that this method is fast, energy efficient and non-critical in the placement and handling of the phototools. An even simpler and more basic production process is illustrated by the system of FIG. 5, wherein the second step is achieved without patterned or blocked radiation patterns, simply by the use solely of the surrogate phototool provided in the first step in a second step for polymerizing the liquid polymer portion of the polymer layer underneath the barrier skin pattern 13 (FIG. 2). Thus the leftmost region 50 represents the first photopatterning step, and region 51 toward the right represents the second photopatterning step.

In the first step the radiation source 51, typically a 5 KW UV lamp forty inches (1+ m) above the surface of the photopolymer on a substrate 52 passing through compartment 53 having a non-reacting gas atmosphere (nitrogen or carbon dioxide) by means of a conveyor belt 54 for example, so that a ten second exposure may occur within the protective atmoshphere, as before described, causing the phototool 15 to produce the surrogate phototool pattern in the photopolymer layer on substrate 52. Note that the phototool here is only dedicated to the individual workpieces a very short time for photopolymer development (of the order of ten seconds), thereby making high volume production a reality.

The so processed and now photomasked substrates 52P are by some suitable transition means 55 transferred to a slowly moving conveyor belt 56 through the radiation field of the lower energy (2.5 KW) lamp 57 for a period such as one minute. This serves to polymerize the layer on the substrate 52P through its thickness under the skin (13) pattern without changing the liquid state of the layer pattern defined by the liquid surfaced polymer on the substrate. This exposure step is achieved in air in a conventional type light tunnel with low energy and without a dedicated external phototool or its registry requirement, etc.

Figure 6:
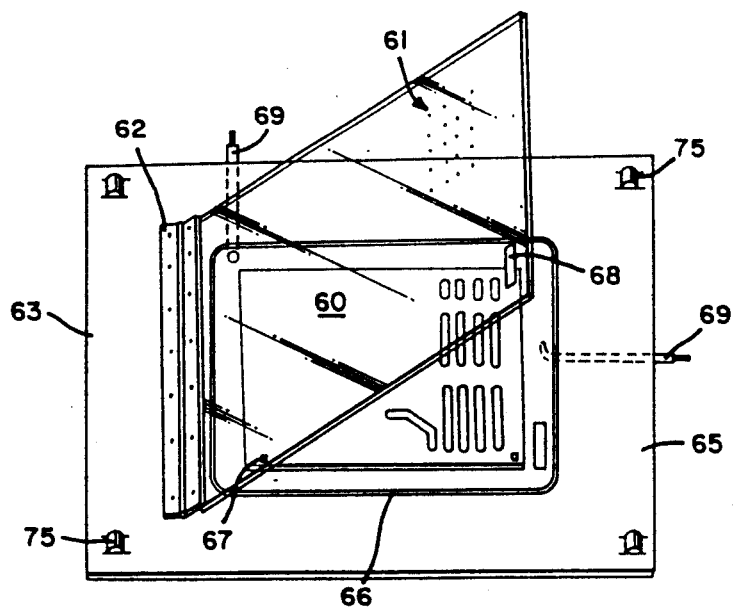
FIG. 6 is a perspective sketch of a clamshell fixture used for practicing the invention, wherein gas may be admitted between a photo transparency and the polymer coated surface of a printed wiring board to blanket the surface, and thereafter removed and/or replaced, in accordance with the teachings of this invention.

The clam shell embodiment of FIG. 6 provides a convenient fixture for the conservation of the protective gas layer (Nitrogen or carbon dioxide) and if desired the alteration of such atmospheres with air, since one gas can be replaced by another in a rapid purging cycle. Thus a phototool transparency 60 having opaque portions 61 is hinged at 62 to a mounting surface 63 to open and close a gas containing compartment having gas entry and exit ports 69. The photopolymer covered substrate 58 is registered by pegs 66, or the like. Closure or latching structure 68 is provided and rollers 75 for moving the fixture past a radiation source or into a light tunnel if desired.

Figure 4:
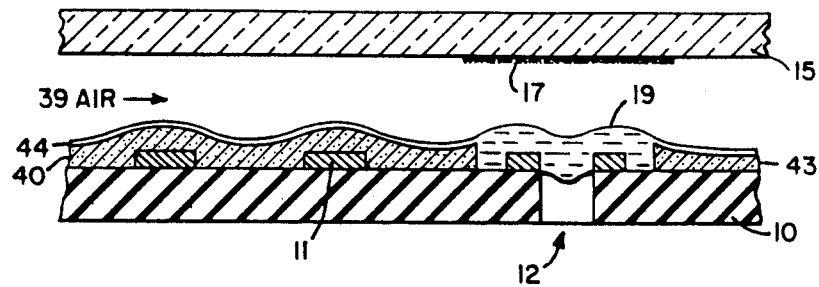
FIG. 4 is a system sketch in cross section of the photopolymer coated printed wiring board in position during a first sequential exposure step in the presence of air in accordance with a further embodiment of the invention.

The two photoexposure steps may also be reversed in order with particular advantage for some applications, as will become evident from the FIG. 4 embodiment. Now the first exposure is made with an air blanket 39 in contact with the photopolymer layer surface, using a conventional off-contact phototool 15 with radiation blocking image patterns 17 thereon, and as before shown in the presence of un-collimated light. After a long exposure of thirty seconds or more to high energy radiation, the photopolymer layer is polymerized below its surface 43 and has a liquid state surface covering 44, as conventionally expected with air exposed liquid photopolymer surfaces. The curing is from substrate surface outward, so the polymer layer is firmly bonded to the substrate surface.

The second exposure step now follows through the transparency with a low energy flash after replacing the air blanket on the polymer surface with a non-reacting gas. The portion 19 remains in liquid polymer state throughout it layer thickness for washing out by solvent in a conventional development step.

Photopolymer characteristics are critical to the performance of this method. For example, a high ratio of oxygen inhibition of the wet surface compared with the cured skin barrier surface is a novel requirement imposed by this invention. The production of chemical resistance of the polymerized portions to washout solvents with low radiant energy is also desirable as well as the bonding characteristics to the substrate surface. The photopolymer in the liquid state should be of a pastelike viscosity to be deposited as a layer on the substrate by screen printing or the like with no residual air bubbles on either surface. This screen printing could be pre-patterned, if desired, in the manner described in my U.S. Pat. No. 4,610,841, Sept. 9, 1986. The photosensitivity to radiation should conform with the criteria hereinbefore described. For solder masking properties there should be good adhesion to the substrate and copper wiring surfaces particularly in the presence of molten solder temperatures. The electrical resistance of layers as thin as 0.001 inch (0.003 cm) under all environmental conditions need be high to avoid circuit defects. Resolution need be good, in the order of more than 100 lines per inch, with the radiation sensitivity such to reject stray uncollimated radiation on the liquid state surfaces. A photopolymer composition providing this combination of features is now set forth in Example 1.

EXAMPLE 1

Solder Mask Photopolymer Composition

| Parts by weight | Ingredients |
| --- | --- |
| 80 | CELANESE CELRAD* 3600 UV/EB Resin |
| 20 | Trimethylopropane Triacrylate Diluent |
| 1 | CIBA-GEIGY IRGACURE* 500 Photoinitiator |
| 1 | MALLINCKRODT Co. BYK-052 Defoamer |
| .0003 | Penn Color Co. PCN Green Pigment in Paste dispersion |

*Registered Trade Name

The foregoing two step photopatterning processes of FIGS. 1 through 3 were carried out in the manner described with the phototool displaced 0.02 inches (0.05 cm) off contact from the photopolymer surface. The development washout used butyl cellosolve as a solvent. After the two described steps a final cure was effected in a standard two 200 W per inch lamp UV reactor. The solder mask characteristics were tested with molten solder. The gas environment was controlled with a fixture as shown in FIG. 6. The internal volume of gas was of the order of 15 cubic inches, which was purged of air and replaced with nitrogen in fifteen seconds or less. In a preferred embodiment, carbon dioxide was found to be a non-reacting gas more readily available than nitrogen.

EXAMPLE 2

Reversing the Two Photopatterning Steps

The sequence of the exposure steps was reversed as described in connection with the FIG. 4 embodiment with the first exposure step of thirty seconds and the second step of twelve seconds.

EXAMPLE 3

Tenting Holes

One important requirement for solder masks is the ability to plug or tent selected holes in the board, as shown at 12 in FIG. 1. It is necessary to be able to plug the holes with hardened photopolymer to prevent molten solder from being pumped hardened photopolymer to prevent molten solder from being pumped through the hole from the underside, thereby forcing solder up and under electrical components to cause short circuits.

Holes of up to 0.03 inch (0.08 cm) in diameter were plugged by using the process of Examples 1 and 2, preceded by a coating step which forced liquid photopolymer into the holes, as depicted by photopolymer portion 14 bridging hole 12 (FIG. 1). In order to plug the holes during the coating step a squeegee was crafted so as to deposit extra liquid photopolymer into holes while maintaining the controlled thickness on the surface of the board. The leading edge of the squeegee, that is, the edge in contact with the screen fabric, was rounded, so as to deviate from the normal square edge. Holes so filled were subsequently permanently plugged by deleting the corresponding opaque areas 17 from phototransparency 15 so as to harden the photopolymer 14 in hole 12. When cured and soldered as previously described, the plugs were intact following a hot air leveling step.

EXAMPLE 4

Merging First And Second Photopatterning Steps

The two distinct exposure steps of Examples 1 and 2 were replaced by a single exposure step during which time the resident gas was replaced by a second gas. The resulting photopatterns were inferior to those produced by Examples 1 and 2, since the gaseous state during the transition period was hard to predict, making it difficult to get the depth of cure required without overexposure. However there was a distinct advantage in the short cycle time.

EXAMPLE 5

Non-Collimated Light Shadow Compensation

When the phototransparency 15 is off-contact by a distance in the order of 0.02 inch 0.05 cm) as shown in FIG. 2 and when the light energy is non-collimated and comes from a point source, the resulting skin layer photopatterns 13 may be displaced or shifted from the position of the corresponding phototransparency images. This shift is caused by the light rays 18 radiating from the source in a radial, not parallel pattern. The shadow cast on the photopolymer surface by the opaque areas 17, will therefore be in dimensional agreement with the phototransparency only for points directly beneath the lamp centerline. At the extreme edge of the substrate the deviation of the light rays might reach the order of fourteen degrees and the images formed in the photopolymer will be displaced by the order of 0.005 inches (0.08 cm). This shift is corrected by using a photoreduced phototransparency image so that when the shift occurs the resulting photopatterns will be correctly registered with the features of substrate 10 and metal conductors 11 on the printed wiring board. Thus a master phototransparency in dimensional agreement with the substrate is photoreduced by 0.07 percent in the Example 1 process to improve the registration.

EXAMPLE 6

Gas Saving Sequence

When a single fixture as in FIG. 6 is used to change the gas environment for the two radiation steps, gas expenditure and processing time is decreased by processing two sequential substrates with the same gaseous environment thereby only requiring one gas change per substrate. This is possible because the two radiating steps are reversible in order as long as an external phototool is used in both steps.

EXAMPLE 7

Board Salvage

Salvaging reject printed wiring boards in the production process is readily done in this invention by controlling the amount of radiating energy, as may be seen from the FIG. 5 inspection station 59. Before a post inspection cure step more thoroughly bonding the polymer to the substrate is applied either in the process steps or as a separate bonding step at a later time, the polymer may be radiated just enough to bond the layer to the substrate enough that it may be stripped without damage to an expensive circuit board thereunder. Typically the post cure could comprise a longer time in the light tunnel after inspection, where defective boards could be removed for salvage and rework.

Having improved the state of the art with novel processes and materials, those features of novelty which illustrate the spirit and nature of the invention are set forth with particularity in the following claims.

I claim:

1. The method of producting polymerized patterns in photopolymer layers disposed on a substrate by photoexposure with actinic radiation, comprising the steps of:
    disposing on a substrate with an outer surface disposed for photoexposure a layer of photopolymer having the property of polymerizing in the presence of actinic radiation energy with different radiation energy quantities required to polymerize the layer when the surface is contacted with different media,
    radiating the layer through an off-contact phototool image pattern with a controlled amount of radiation energy to polymerize the layer through only a portion of its thickness with a first polymerization step in the presence of a gaseous medium on the layer surface that reduces oxygen inhibition of polymerization in contact with the outer surface of the layer, thereby to produce two patterned areas of polymer defined by the image pattern respectively with polymerized polymer through only a surface stratum part of the layer thickness and unpolymerized polymer through the entire layer thickness, replacing the first medium with air as a second gaseous medium in contact with the layer surface to inhibit the polymerization throughout the layer thickness in the presence of radiation where the surface is unpolymerized, and then radiating the layer with a predetermined amount of unpatterned radiation energy thereby to polymerize the photopolymer layer in the surface stratum polymerized areas through the thickness of the layer and to prevent substantial polymerization in the area of unpolymerized polymer through the entire thickness, whereby the polymerized surface stratum area serves as a surrogate in-situ phototool for this radiating step.

2. The process of claim 1 wherein the photopolymer layers comprise liquid photopolymer, and said gaseous medium in the first polymerization step is a non-reacting gas of the class containing nitrogen and carbon dioxide.

3. The process of claim 1 wherein the actinic radiation is uncollimated.

4. The method of claim 1 further comprising the ordered step of changing with the first radiating step the photosensitivity of the layer to actinic radiation in the presence of air on the surface of the photopolymer layer in the area covered by said polymerized surface stratum partly through the thickness of the layer thereby to exhibit a higher sensitivity area compared to the sensitivity of the area unpolymerized through the thickness of the layer and the ordered step in the last radiating step of radiating with low energy radiation insufficient to polymerize the photopolymer layer with the presence of air on an unpolymerized outer surface of the polymer layer.

5. The method of claim 1 further comprising the step of polymerizing the layer through different portions of its thickness in said two radiating steps with a limited magnitude of radiating energy during the last said radiating step for producing good resolution without overexposure.

6. The method of claim 1 wherein the substrate comprises a printed wiring board with through holes therein, further comprising the steps of:

plugging selected ones of the through holes with the polymer layer, and polymerizing the polymer layer throughout its thickness at the areas of the plugged holes.

7. The method of claim 6 further comprising the steps of:

coating the polymer layer on the printed wiring board with a squeegee in contact with a screen fabric with a leading edge rounded to deposit extra polymer into the holes while maintaining a controlled thickness of the polymer layer on the board.

8. The method of claim 1 including the step of merging the first and second radiation steps while replacing said first gas medium with the second gaseous medium in a fixture of limited gas volume readily purgible during the time span of one of the radiation steps.

9. The method of producing and employing a phototool in-situ in an unpolymerized photopolymer layer disposed on a substrate to constitute part of that layer comprising the steps of radiating the photopolymer layer through a phototool pattern with a controlled amount of radiation energy directed toward the substrate to produce partial polymerization through the thickness of the layer in a skin surface stratum pattern defined by that of the phototool pattern to produce said phototool in-situ and polymerizing the layer throughout its thickness under the stratum pattern with unpatterned radiation of controlled energy directed through the skin surface pattern comprising said in-situ phototool to produce a polymerized pattern through the thickness of said layer only in said pattern.

* * * * *